(12) United States Patent
Keating et al.

(10) Patent No.: US 7,045,407 B2
(45) Date of Patent: May 16, 2006

(54) AMORPHOUS ETCH STOP FOR THE ANISOTROPIC ETCHING OF SUBSTRATES

(75) Inventors: Steven Keating, Beaverton, OR (US); Chris Auth, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/750,054

(22) Filed: Dec. 30, 2003

(65) Prior Publication Data

US 2005/0148147 A1 Jul. 7, 2005

(51) Int. Cl.
*H01L 21/336* (2006.01)
(52) U.S. Cl. .................... 438/198; 438/300; 438/524; 438/705
(58) Field of Classification Search ............. 438/198, 438/300, 516, 524, 528, 705, 752, 753; 257/327, 257/628
See application file for complete search history.

(56) References Cited

U.S. PATENT DOCUMENTS

| 4,857,986 | A | * | 8/1989 | Kinugawa | 257/255 |
| 5,864,161 | A | * | 1/1999 | Mitani et al. | 257/347 |
| 5,869,359 | A | * | 2/1999 | Prabhakar | 438/149 |
| 6,060,403 | A | * | 5/2000 | Yasuda et al. | 438/765 |
| 6,071,783 | A | * | 6/2000 | Liang et al. | 438/301 |
| 6,461,967 | B1 | * | 10/2002 | Wu et al. | 438/705 |
| 6,774,000 | B1 | * | 8/2004 | Natzle et al. | 438/300 |
| 6,784,076 | B1 | * | 8/2004 | Gonzalez et al. | 438/426 |

OTHER PUBLICATIONS

Madou, Marc J., Fundamentals of microfabrication, pp. 172-174 and 209, 211 and 212, © 1997 by CRC Press LLC, 2000 Corporate Blvd., N.W., Boca Raton, Florida 33431.

* cited by examiner

*Primary Examiner*—Trung Dang
(74) *Attorney, Agent, or Firm*—Blakely, Sokoloff, Taylor & Zafman LLP

(57) ABSTRACT

Methods of forming an amorphous etch stop layer by implanting a substrate with an element that is electrically neutral within the substrate are described. The use of elements that are electrically neutral within the substrate prevents electrical interference by the elements if they diffuse to other areas within the substrate. The amorphous etch stop layer may be used as a hard mask in the fabrication of transistors or other devices such as a cantilever.

7 Claims, 14 Drawing Sheets

AMORPHOUS ETCH STOP FOR THE ANISOTROPIC ETCHING OF SUBSTRATES

BACKGROUND OF THE INVENTION

1. Field of the Invention

The present invention relates to the field of etching substrates for use in integrated circuits, and more particularly to the field of anisotropic wet etching and the use of amorphous etch stop regions.

2. Discussion of Related Art

A problem found in etching substrates on which structures have been formed is microloading. Microloading is the influence that the differing densities of structures in different regions on a single substrate will have on the etch geometry in those different regions. Examples of different etch geometries in regions having different structure densities are illustrated in FIG. 1. Region 1 is a region having a relatively high density of structures 110 formed on the substrate 120. The structures 110 used for example in FIG. 1 are transistor gates 130 having sidewall spacers 140. In this example, the substrate is etched to form recesses that are subsequently backfilled with a doped material to form source/drain regions. Region 2 is a region having a relatively low density of structures 110 formed on the substrate 120. The etched areas 150, which may be source/drain regions for transistor gates 130, have different etch geometries in regions 1 and 2. The etched areas 150 in the relatively dense Region 1 undercut less area of the sidewall spacers and transistor gates than do the etched areas 150 in Region 2 and also tend to have less depth than the etched areas 150 in Region 2. For example, as illustrated in FIG. 1, the undercut areas 160 in Region 1 only undercut the sidewall spacers 140, but the undercut areas 170 in Region 2 undercut both the sidewall spacers 140 and the transistor gates 130. Microloading is a significant problem affecting the performance of integrated circuits because it results in the formation of devices on a substrate that have inconsistent structures as compared to other devices on the same substrate.

Microloading has been dealt with in the past by forming dummy structures on a substrate so that the density of structures on the substrate is equal everywhere on the substrate. Dummy structures are not ideal because they take up space on a substrate that may be put to better use and because large spaces between structures may be needed for specific device requirements.

Microloading has also been dealt with in the past by forming an etch stop within the substrate to control the depth of the etching. The prior art has formed an etch stop in the substrate by doping the substrate with extrinsic elements such as boron (B), phosphorous (P), and arsenic (As). The etch stop helps control the depth of an anisotropic wet etch. By using an etch stop with an anisotropic wet etch, both the depth of the area etched as well as the width (undercut) of the area etched may be controlled. The drawback to using elements such as boron, phosphorous, and arsenic is that they may diffuse from the etch stop area into regions where they may cause electrical interference with devices formed in or on the substrate.

A double spacer process has also been used to counter the effects of lateral undercutting caused by microloading. In this method the lateral undercut is controlled by first forming narrow sidewall spacers on either side of the gate electrodes. A hole is then etched with an anistropic dry etch and then filled with the material of interest. Another sidewall spacer is then formed and the substrate between the spacers is implanted with an extrinsic element. But, this method requires a number of steps and will not fully prevent the problem of inconsistent undercutting due to microloading and cannot be used when undercutting for structures such as source/drain tip extension regions.

DETAILED DESCRIPTION OF THE PRESENT INVENTION

Described herein are methods and devices employing an amorphous etch stop layer formed by implanting elements that are electrically neutral within a substrate. In the following description numerous specific details are set forth. One of ordinary skill in the art, however, will appreciate that these specific details are not necessary to practice embodiments of the invention. While certain exemplary embodiments of the invention are described and shown in the accompanying drawings, it is to be understood that such embodiments are merely illustrative and not restrictive of the current invention, and that this invention is not restricted to the specific constructions and arrangements shown and described because modifications may occur to those ordinarily skilled in the art. In other instances, well known semiconductor fabrication processes, techniques, materials, equipment, etc., have not been set forth in particular detail in order to not unnecessarily obscure embodiments of the present invention.

Methods of forming an amorphous etch stop layer by implanting a substrate with an element that is electrically neutral within the substrate are described. The use of elements that are electrically neutral within the substrate prevents electrical interference by the elements if they diffuse to other areas within the substrate. The amorphous etch stop layer may be used in the fabrication of transistors or as a hard mask to form other devices such as a cantilever.

Figure 1:
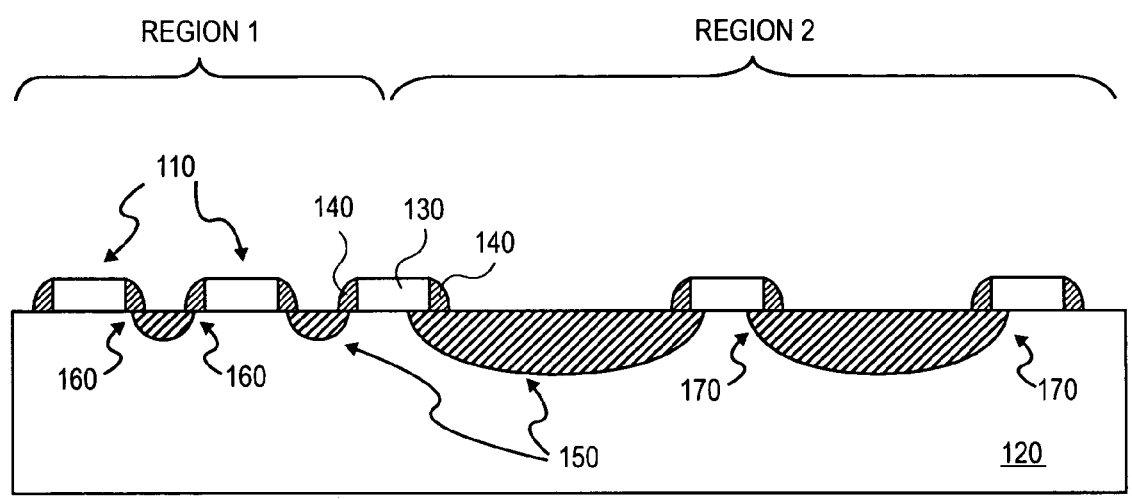
FIG. 1 is an illustration of a substrate demonstrating microloading after a prior art etch.
Figure 2A:
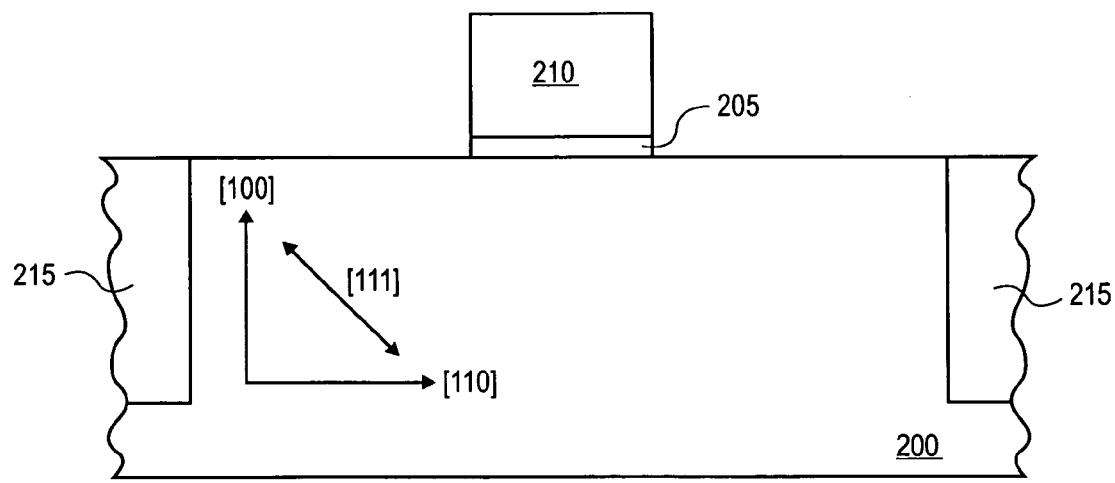
FIGS. 2a–2j illustrate forming a transistor having source/drain implant regions and employing an amorphous implant region as an etch stop.

In one embodiment, an amorphous etch stop region may be formed in a substrate to fabricate a transistor. A substrate 200 is provided in FIG. 2a. The substrate 200 may be a single crystal or polycrystalline semiconductor material such as silicon or germanium. In FIG. 2a a single crystal silicon substrate 200 is illustrated having a [100] crystal orientation in the y plane, a [110] orientation in the x plane, and a [111] crystal orientation in the plane diagonal to the x and y planes. The substrate 200 may contain both p-type and n-type wells depending on whether a PMOS or NMOS transistor is formed. The area of the substrate illustrated in FIG. 2a may be a p-type doped with a p-type dopant such as boron or gallium, or alternatively may be an n-type well doped with an n-type dopant such as phosphorous or arsenic. A gate dielectric 205 is formed on the substrate 200. The gate dielectric 205 may be a material such as a nitrided oxide layer. A gate electrode 210 is formed above the gate dielectric 205. The gate electrode 210 may be formed by the blanket deposition of a polysilicon layer and the subsequent patterning of the polysilicon layer into the gate electrode 210. Isolation regions 215 are formed in the substrate 200 to separate n-type wells from p-type wells, and to therefore isolate adjacent transistors. The field isolation regions 215 may be, for example, shallow trench isolation (STD) regions formed by etching a trench into the substrate 200 and subsequently filling the trench with deposited oxide and planarizing.

Figure 2B:
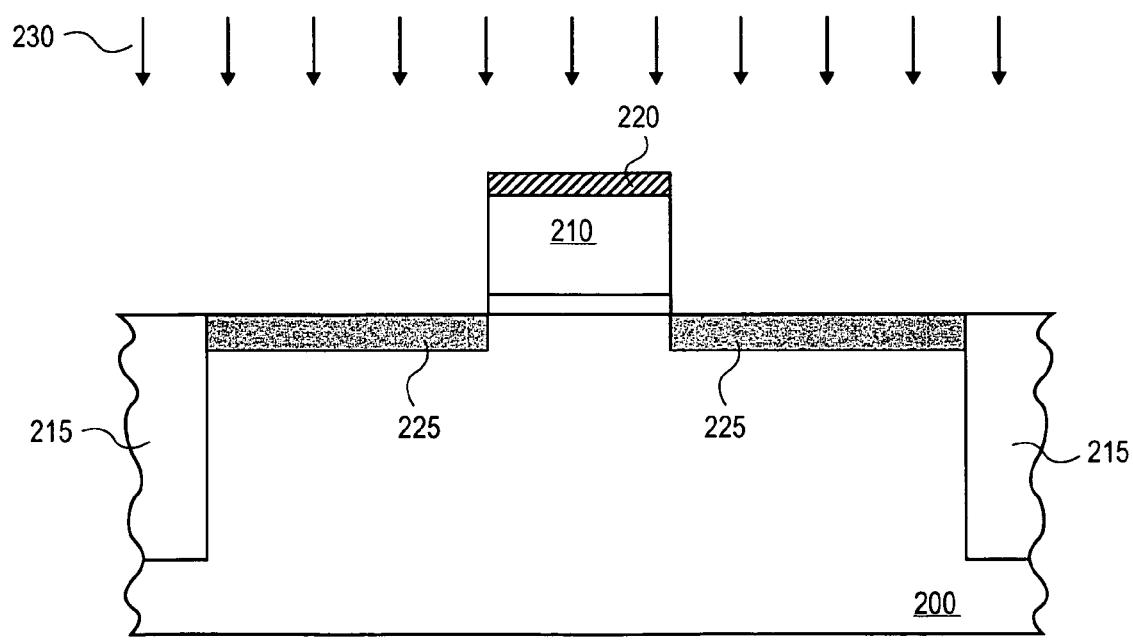

As illustrated in FIG. 2b, a hard mask 220 is formed over the gate electrode 210 to protect the gate electrode 210 during subsequent implantation processes. A dopant 230 is implanted into the substrate 200 to form the source-drain tip regions 225. For a PMOS transistor the dopant 230 will be a p-type dopant such as boron or gallium, and the substrate 200 will be an n-type well in this region between the isolation regions 215. For an NMOS transistor the dopant 230 will be an n-type dopant such as phosphorous or arsenic, and the substrate 200 will be a p-type well in this region between the isolation regions 215. The source/drain tip implant regions 225 may have a depth of less than approximately 10 nm and a width spanning the region between the gate electrode 210 and the isolation regions 215.

Figure 2C:
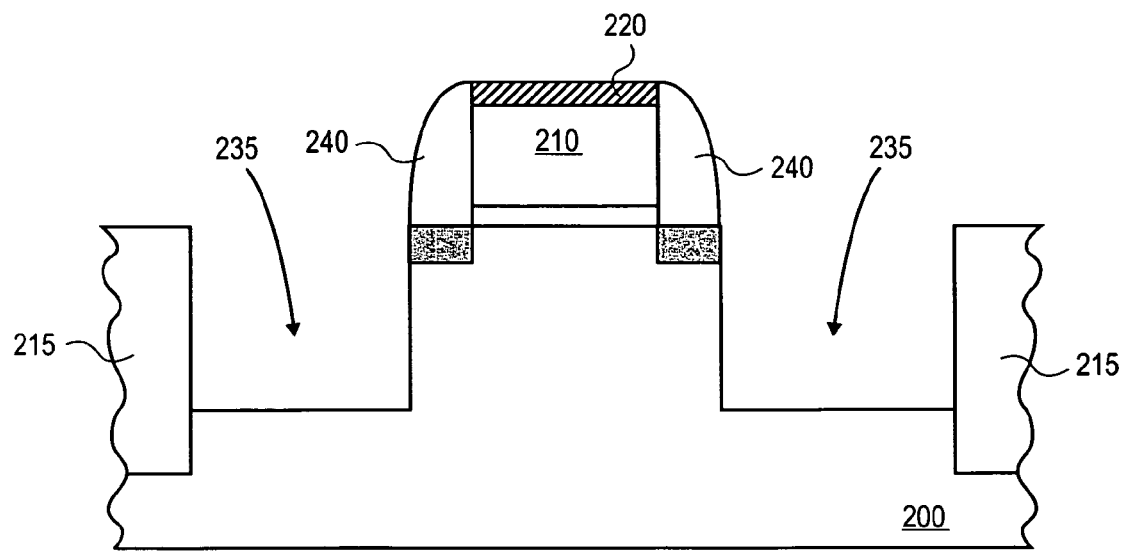

FIG. 2c illustrates an embodiment where recesses 235 are etched into the substrate. Sidewall spacers 240 are formed before etching the recesses 235 by a conventional process well known to those skilled in the art. The substrate is then etched to form the recesses 235. The recesses 235 may be etched by an anisotropic plasma etch using compounds such as gaseous $Cl_2$, $SF_6$, or HBr that will etch through the source/drain tip implant regions 225 and the substrate 200. The recesses 235 may have a width in the approximate range of 40 nm and 1000 nm, and a depth in the approximate range of 40 nm and 200 nm.

Figure 2D:
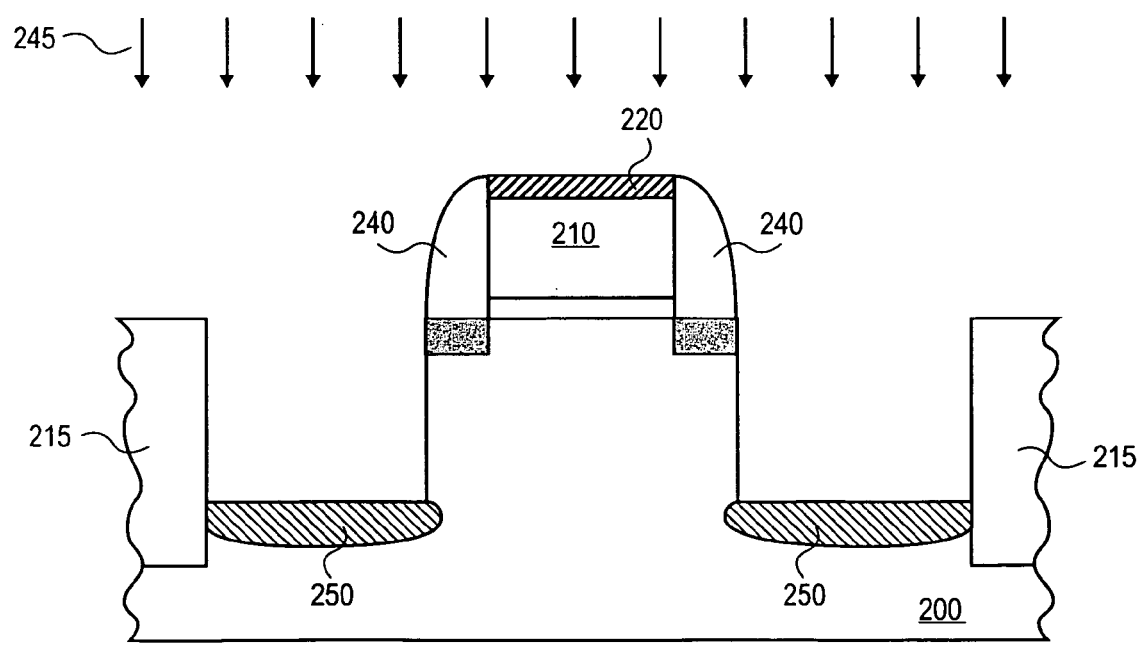

An ionic species 245 may then be implanted into the bottom of the recesses 235 in the substrate 200 as illustrated in FIG. 2d to form the amorphous etch stop region 250. Prior to implanting the ionic species 245 a hard mask 325 is formed over the gate electrode 310 to protect the gate electrode during the implantation. The amorphous etch stop region 250 is formed by disrupting the bonds of the substrate 200 with the implant process. The bonds of the substrate 200 are disrupted to the extent that they will create an etch stop region for a wet anisotropic etchant. The parameters involved in disrupting the bonds of the substrate 200 include the accelerating energy, ionic radius, and mass of the ionic species 245. Almost any low energy condition for which the implant is not reflected from the surface of the substrate 200 will disrupt the bonds of the substrate 200 and form an amorphous region such as the amorphous etch stop region 250. The ionic species 245 may be implanted into the bottom of the recesses 235 in a dose of approximately between $5\times e^{14}$ atoms/cm$^2$ and $1\times e^{15}$ atoms/cm$^2$, and at an implant energy within the approximate range of 1 KeV and 20 KeV to form a concentration of the ionic species 245 within the amorphous etch stop region 250 of approximately $1\times e^{21}$ atoms/cm$^3$. The implant energy may be dependent on the ionic species 245 being implanted and in one embodiment the implant energy is as low as possible to avoid unnecessary damage to the substrate 200. The ionic species 245 may be implanted to a depth of up to approximately 50 nm or may be deposited onto the surface of the bottom of the recesses 235.

The ionic species 245 is an element that is electrically neutral within the substrate so that it will not interfere electrically with devices in or on the substrate 200 if it diffuses within the substrate. In one embodiment the ionic species 245 that is electrically neutral within the substrate 200 may be an element that is the same as the elements forming the substrate. In this embodiment the element implanted into a silicon substrate 200 may be silicon, or alternatively, the element implanted into a germanium substrate 200 may be germanium. In alternate embodiments, the ionic species 245 that is electrically neutral within the substrate may be an element that has a low solubility in the substrate 200 and thus may not substitute for atoms within the crystal lattice of the substrate. Elements that may be electrically neutral within silicon are those that have an ionic radius greater than 1.2 times the size of the covalent radius of silicon and those that have an ionic radius less than 0.7 times the size of the covalent radius of silicon. The covalent radius of silicon is approximately 111 picometers (pm), so the elements that may be electrically neutral within silicon may be those with an ionic radius greater than 130 pm and those with an ionic radius less than 80 pm. Elements with these particular ionic radii may not substitute for atoms in the silicon crystal lattice and have very low solubility within silicon, thus making such elements electrically neutral within silicon. Ionic species 245 that fit the ionic radii criteria for a silicon substrate include, for example, oxygen, nitrogen, the noble elements (Ne, Ar, Kr, etc.), the alkaline metals of column I of the periodic table (H, Li, Na, K, Rb, Cs, Fr), and the alkaline earths of column II of the periodic table (Be, Mg, Ca, Sr, Ba, Ra). The ionic species 245 may be one type of element, or a combination of elements.

Figure 2E:
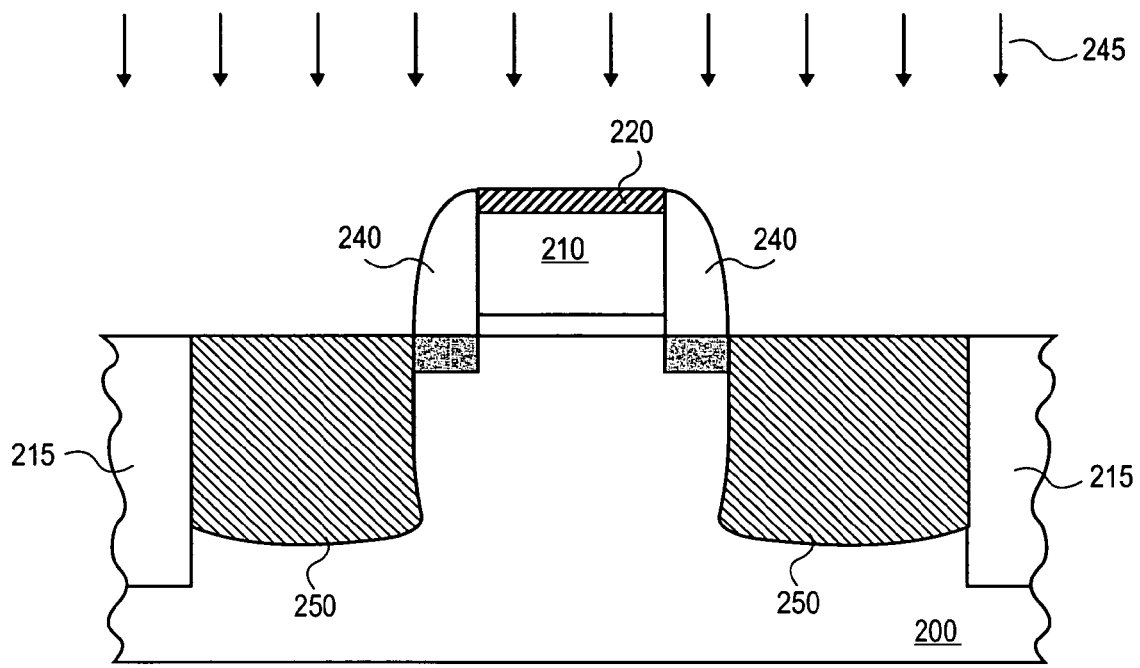
Figure 2F:
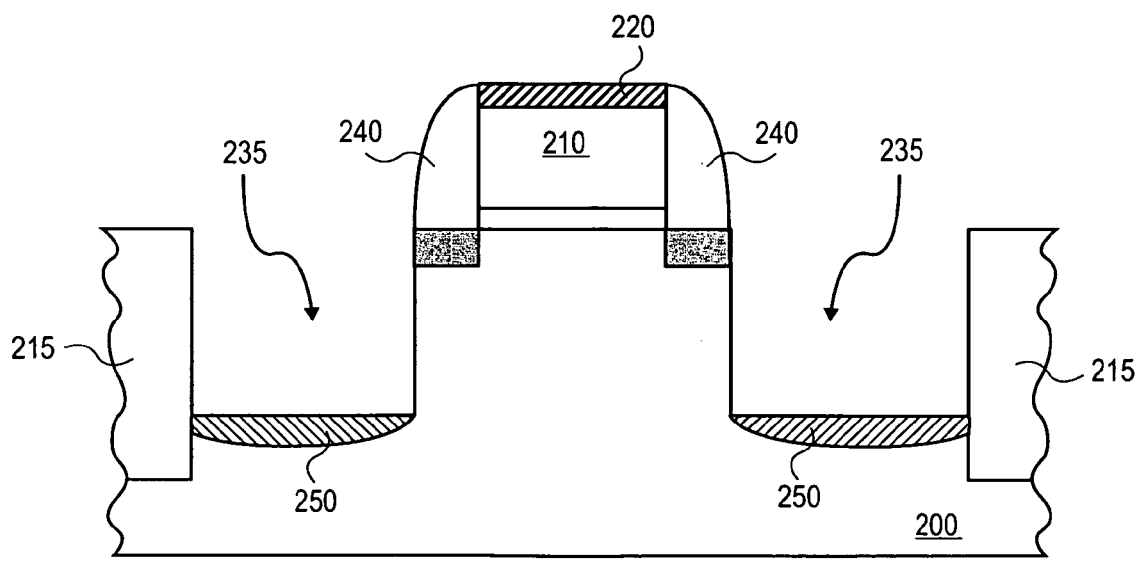

FIGS. 2e and 2f illustrate an alternate embodiment where instead of first etching recesses 235 as illustrated in FIG. 2c and subsequently implanting the bottoms of the recesses 235 with an ionic species 245 as illustrated in FIG. 2d, the ionic species 245 is implanted into the substrate 200 before etching recesses 235 into the substrate 200. In FIG. 2e, the ionic species 245 may be implanted into the substrate 200 to form the amorphous etch stop region 250. The ionic species 245 may be implanted into the substrate 200 in a dose of between $1\times e^{15}$ atoms/cm$^2$ and $1\times e^{16}$ atoms/cm$^2$ and at an implant energy within the approximate range of 10 KeV and 40 KeV. The implant energy may be dependent on the implant material 245 being implanted and the implant energy may be as low as possible to avoid damage to the substrate 200. The ionic species 245 may be implanted to a depth slightly exceeding the depth of the recesses 235 to form the amorphous etch stop region 250 of FIG. 2e. As described above in relation to FIGS. 2c and 2d, the ionic species 245 is a material that is electrically neutral within the substrate 200 and may be any of the particular elements described above. As illustrated in FIG. 2f, recesses 235 may then be etched in the substrate 200 through the upper portion of the amorphous etch stop region 250 by an anisotropic plasma etch with a compound such as $Cl_2$, $SF_6$ or HBr. The amorphous etch stop region 250 does not act as an etch stop for the anisotropic plasma etch, but will act as an etch stop for an anisotropic wet etch because it acts as a mask to protect the substrate surface, as will be described below. The recesses 235 may have a width in the approximate range of 40 nm and 1000 nm, and a depth in the approximate range of 40 nm and 200 nm.

Figure 2G:
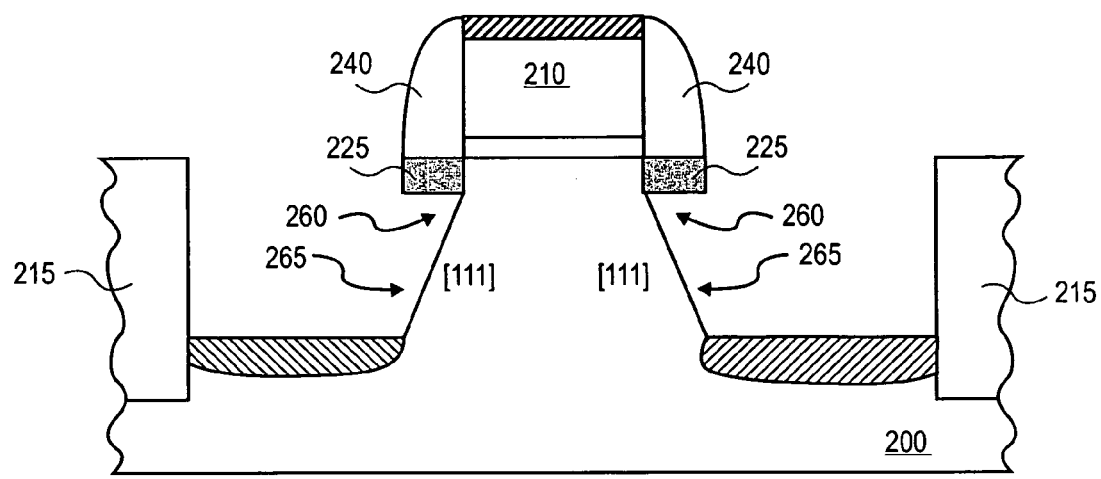

In FIG. 2g, the substrate 200 is etched with an anisotropic wet etch to form an etched undercut region 260 having sharp diagonal faceting 265 along the [111] crystal plane. The anisotropic wet etch stops etching on the amorphous etch stop region 250, so that the bottom of the trench is flat. The side wall spacers 240, the source/drain tip implant regions 225, and the STI isolation regions 215 will not be etched by the anisotropic wet etch. The anisotropic wet etch may be an alkaline wet etch having a pH of approximately 10 or higher. The wet etch may be formulated of an aqueous solution containing a base such as KOH (potassium hydroxide), NaOH (sodium hydroxide), NH$_4$OH (ammonia hydroxide), or TMAH (tetramethylammonia hydroxide). For example, a solution of 30% NH$_4$OH by weight may be mixed with water to form an anisotropic etch solution 270 having a concentration of NH$_4$OH by volume percent in the approximate range of 10%–100%, or more particularly a concentration of NH$_4$OH by weight percent in the approximate range of 3%–30%. In order to control the rate of the anisotropic wet etch, the etch may be performed at approximately room temperature. To increase the etch rate the temperature may be increased. The temperature range within which the anisotropic wet etch may be performed is approximately between 15° C. and 80° C., and more particularly approximately 24° C. The etch rate may be in the approximate range of 10 nm/minute and 100 nm/minute. An oxidizing agent is not included in the etch solution because it may oxidize the substrate 200 and stop the anisotropic etching such that the strong faceting 260 along the [111] crystal plane may not occur. The substrate 200 may be etched for a time in the approximate range of 1 minute and 10 minutes. The longer the time of the etch, the more lateral undercutting may result. The distance that the undercut regions 260 are laterally etched may be the width of the side wall spacers 240, as illustrated in FIG. 2g. Therefore the width of the undercut regions may be in the approximate range of 5 nm–100 nm, and more particularly in the approximate range of 10 nm–30 nm.

Figure 2H:
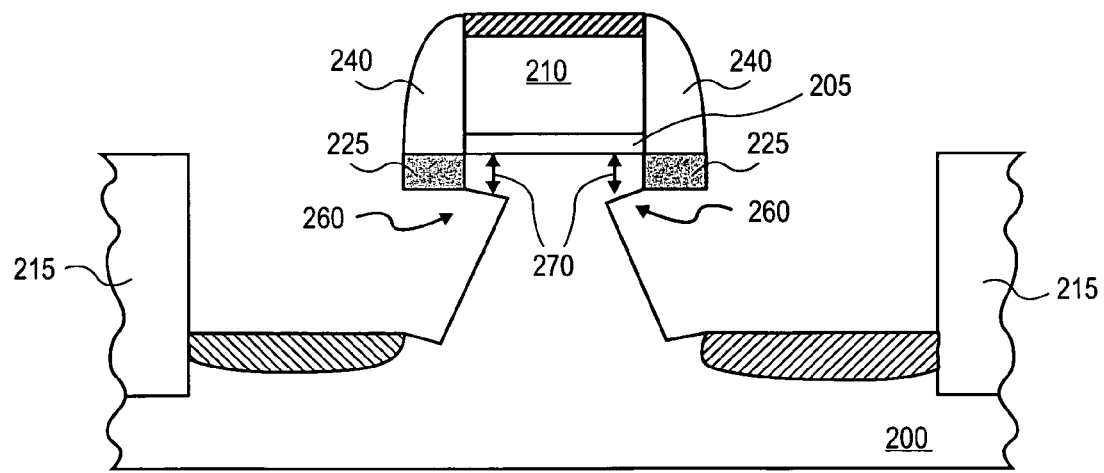
Figure 2I:
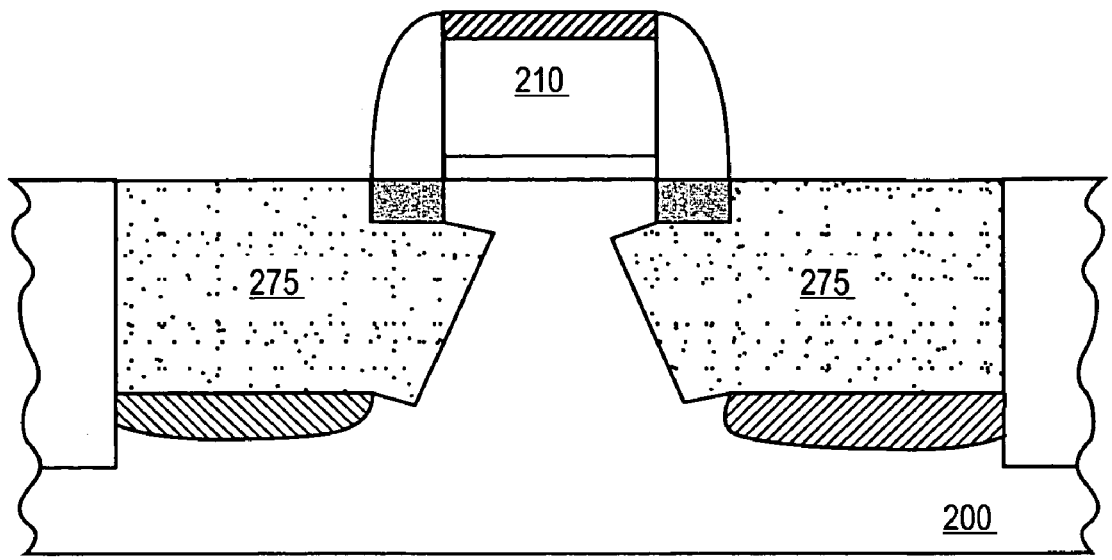
Figure 2J:
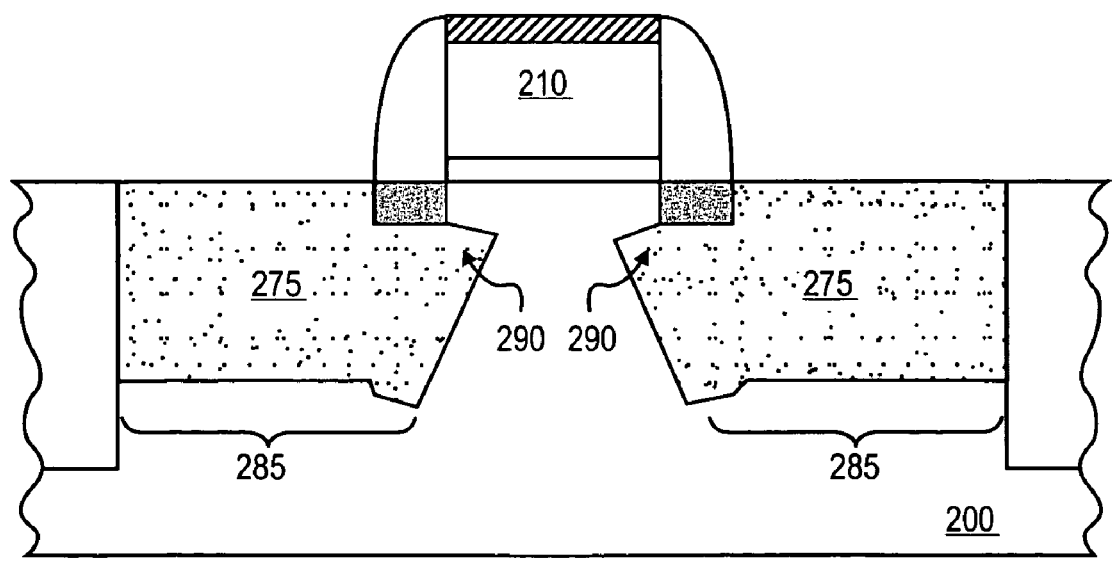

As illustrated in FIG. 2h the undercut regions 260 may be extended under the gate electrode 210 to a distance in the approximate range of 10% to 20% of the width of the gate 210. The source/drain tip implant regions 225 affect the geometry of the undercut regions 260 because the substrate 200 is etched up to the bottoms of the source/drain tip implant regions 225. Therefore, the undercut regions 260, as they extend beyond the source/drain tip implant regions 225 and under the gate electrode 210 will leave a distance 270 of the substrate 200 between the undercut regions 260 and the gate dielectric 205. This may prevent the undercut regions 260 from being etched too close to the gate electrode. The undercut regions 260 under the gate electrode 210 may be extended tip source/drain regions of the transistor after backfilling the recesses 235 and the undercut regions 260 with a doped semiconductor backfill material 275, such as epitaxial silicon germanium, as illustrated in FIG. 2i. As illustrated in FIG. 2j, the amorphous etch stop region 250 may be recrystallized during the backfill process of the backfill material 275 due to the temperature of the back fill process. The temperature of the substrate 200 may reach temperatures in the range of approximately 600° C. and 650° C. during the backfill process. In an embodiment where the implant material 245 is the same element as the substrate 200, the recrystallization of the amorphous etch stop region 250 will make that region similar to the rest of the substrate 200. FIG. 2j illustrates a transistor 280 having source/drain regions 285 and extended tip source/drain regions 290 formed by the doped semiconductor backfill material 275 deposited in the areas formed by the etching process described above.

Figure 3A:
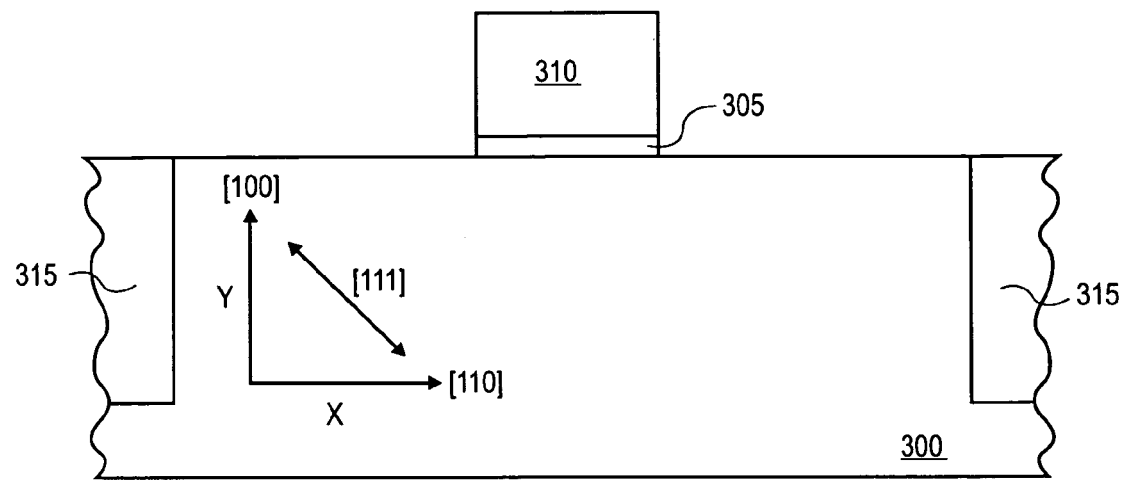
FIGS. 3a–3g illustrate an alternate embodiment of forming a transistor without source/drain implant regions and employing an amorphous implant region as an etch stop.

In an alternate embodiment illustrated in FIG. 3a–3g, a transistor fabricated using an amorphous etch stop region may be formed without source/drain implant regions so that the undercut region of the anisotropic wet etch forms a sharp etch geometry underneath the sidewall spacers of the transistor. A substrate 300 is provided in FIG. 3a. The substrate 300 may be a single crystal or polycrystalline semiconductor material such as silicon or germanium. In FIG. 3a a single crystal silicon substrate 200 is illustrated having a [100] crystal orientation in the y plane, a [110] orientation in the x plane, and a [111] crystal orientation in the plane diagonal to the x and y planes. The substrate 300 may contain both p-type and n-type wells depending on whether a PMOS or NMOS transistor is formed. The area of the substrate illustrated in FIG. 3a may be a p-type doped with a p-type dopant such as boron or gallium, or alternatively may be an n-type well doped with an n-type dopant such as phosphorous or arsenic. A gate dielectric 305 is formed on the substrate 300. The gate dielectric 305 may be a material such as a nitrided oxide layer. A gate electrode 310 is formed above the gate dielectric 305. The gate electrode 310 may be formed by the blanket deposition of a polysilicon layer and the subsequent patterning of the polysilicon layer into the gate electrode 310. Isolation regions 315 are formed in the substrate 300 to separate n-type wells from p-type wells, and to therefore isolate adjacent transistors. The field isolation regions 315 may be, for example, shallow trench isolation (STI) regions formed by etching a trench into the substrate 300 and subsequently filling the trench with deposited oxide.

Figure 3B:
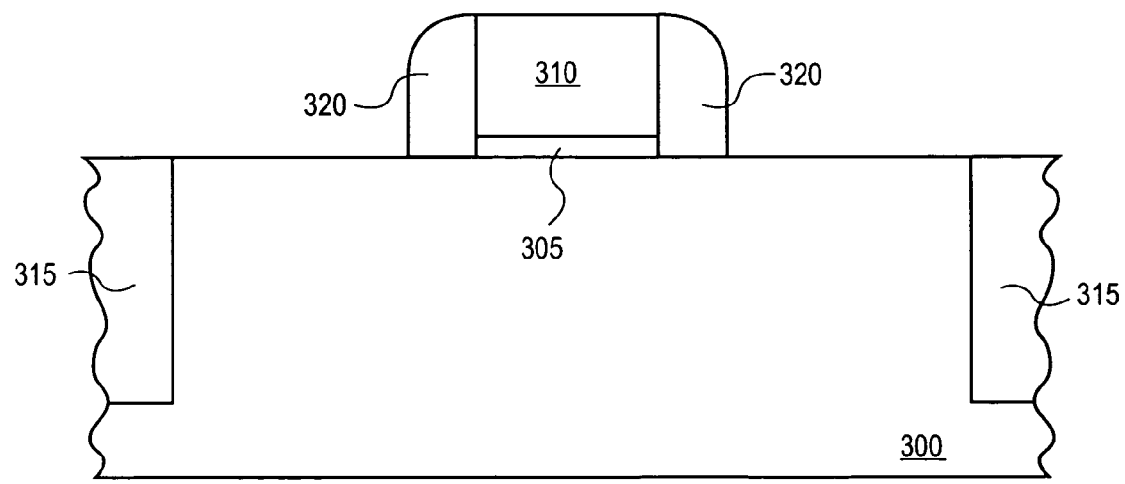
Figure 3C:
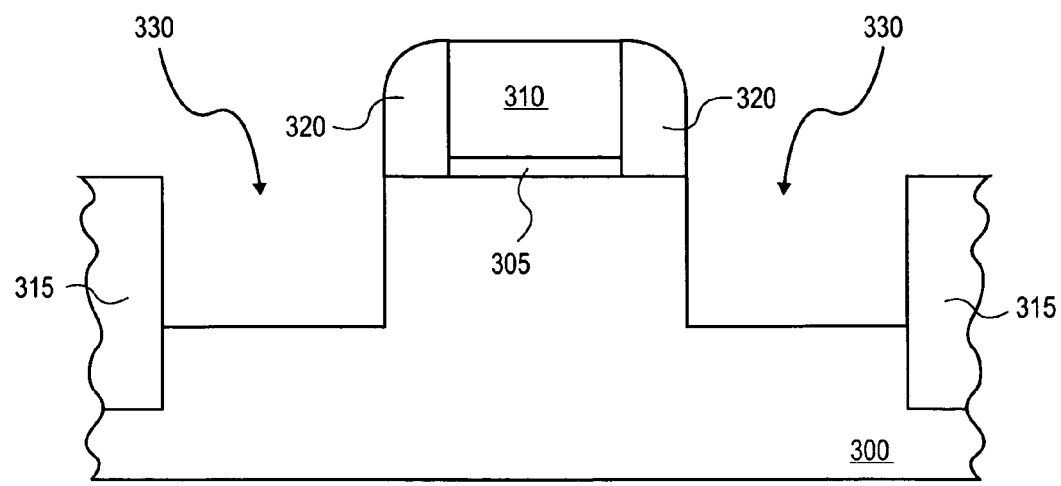

As illustrated in FIG. 3b, a pair of side wall spacers 320 are formed on either side of the gate electrode 310 by conventional methods known to one of skill in the art. Additionally, a hard mask 325 may be formed on the gate electrode 310. FIG. 3c illustrates an embodiment where recesses 330 are etched into the substrate 300 before implanting the substrate 300 with an implant material 335. The recesses 330 may be etched by an anisotropic plasma etch using compounds such as gaseous Cl$_2$, SF$_6$, or HBr. The recesses 330 may have a width in the approximate range of 40 nm and 1000 nm, and a depth in the approximate range of 40 nm and 200 nm.

Figure 3D:
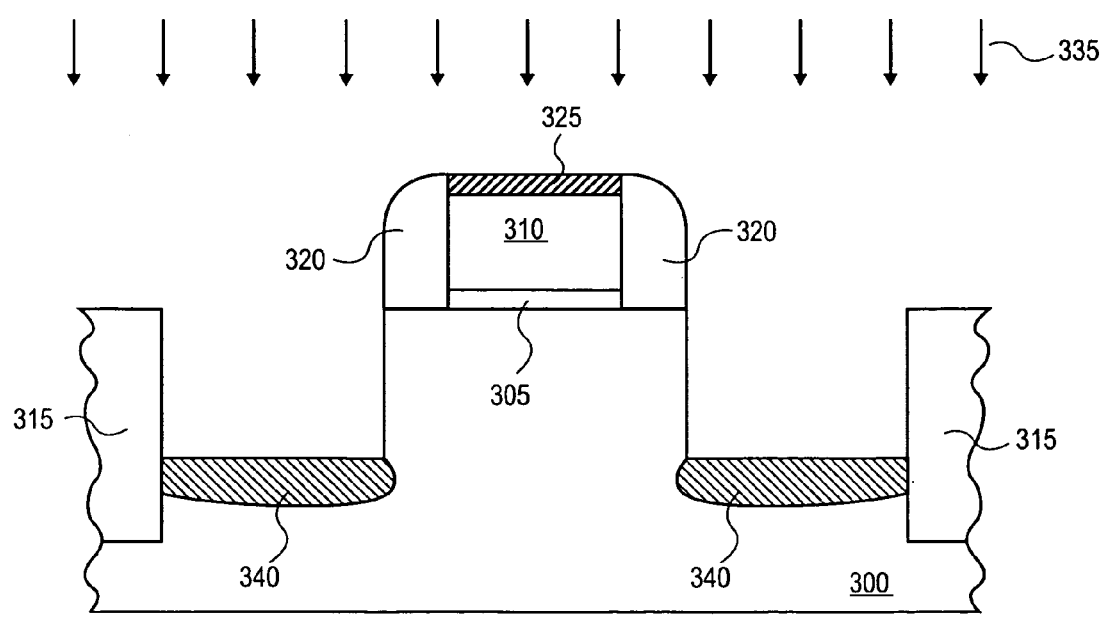

An ionic species 335 may then be implanted into the bottom of the recesses 330 in the substrate 300 as illustrated in FIG. 3d to form the amorphous etch stop region 340. The amorphous etch stop region 340 is formed by disrupting the bonds of the substrate 300 with the implant process. The bonds of the substrate 300 are disrupted to the extent that they will create an etch stop region for a wet anisotropic etchant. The parameters involved in disrupting the bonds of the substrate 300 include the accelerating energy, ionic radius, and mass of the ionic species 335. Almost any low energy condition for which the implant isn't reflected from the surface of the substrate 300 will disrupt the bonds of the substrate 300 and form an amorphous region such as the amorphous etch stop region 340. The ionic species 335 may be implanted into the bottom of the recesses 330 in a dose of approximately between $5 \times e^{14}$ atoms/cm$^2$ and $1 \times e^{15}$ atoms/cm$^2$, and at an implant energy within the approximate range of 1 KeV and 20 KeV to form a concentration of the ionic species 335 within the amorphous etch stop region 340 of approximately $1 \times e^{21}$ atoms/cm$^3$. The implant energy may be dependent on the ionic species 335 being implanted and in one embodiment the implant energy is as low as possible to avoid unnecessary damage to the substrate 300. The ionic species 335 may be implanted to a depth of up to approximately 50 nm or may be deposited onto the surface of the bottom of the recesses 330.

The ionic species 335 is an element that is electrically neutral within the substrate so that it will not interfere electrically with devices in or on the substrate 300 if it diffuses within the substrate. In one embodiment the ionic species 335 that is electrically neutral within the substrate 300 may be an element that is the same as the elements forming the substrate. In this embodiment the element implanted into a silicon substrate 300 may be silicon, or alternatively, the element implanted into a germanium substrate 300 may be germanium. In alternate embodiments, the ionic species 335 that is electrically neutral within the substrate may be an element that has a low solubility in the substrate 300 and thus may not substitute for atoms within the crystal lattice of the substrate. Elements that may be electrically neutral within silicon are those that have an ionic radius greater than 1.2 times the size of the covalent radius of silicon and those that have an ionic radius less than 0.7 times the size of the covalent radius of silicon. The covalent radius of silicon is approximately 111 picometers (pm), so the elements that may be electrically neutral within silicon may be those with an ionic radius greater than 130 pm and those with an ionic radius less than 80 pm. Elements with these particular ionic radii may not substitute for atoms in the silicon crystal lattice and have very low solubility within silicon, thus making such elements electrically neutral within silicon. Ionic species 335 that fit the ionic radii criteria for a silicon substrate include, for example, oxygen, nitrogen, the noble elements (Ne, Ar, Kr, etc.), the alkaline metals of column I of the periodic table (H, Li, Na, K, Rb, Cs, Fr), and the alkaline earths of column II of the periodic table (Be, Mg, Ca, Sr, Ba, Ra). The ionic species 335 may be one type of element, or a combination of elements. In an alternate embodiment, the ionic species 335 may be implanted into the substrate 300 before etching the recesses 330, as described above in relation to FIGS. 2e and 2f.

Figure 3E:
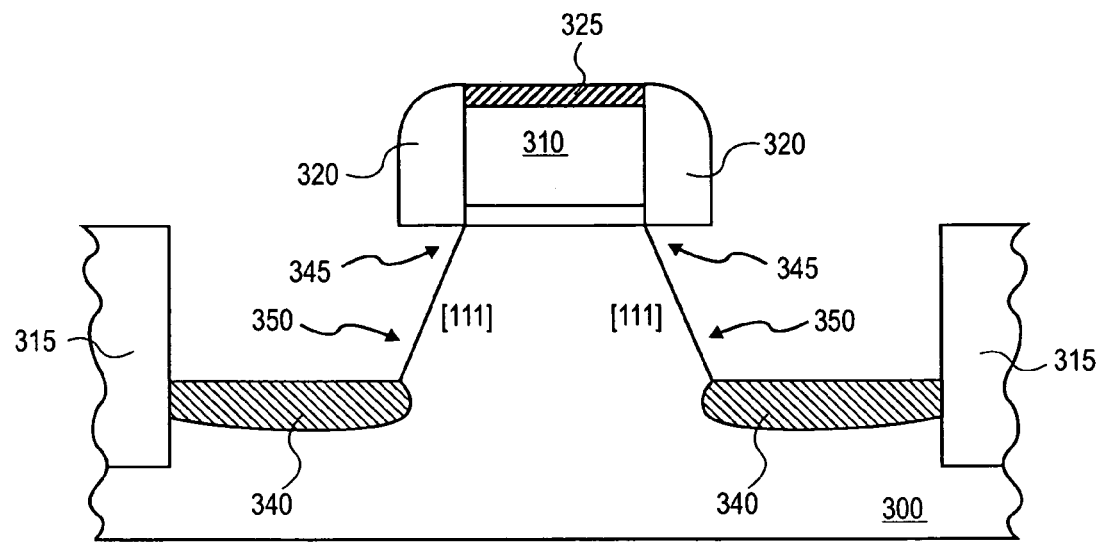

In FIG. 3e, the substrate 300 is etched with an anisotropic wet etch to form an etched undercut region 345 having sharp diagonal faceting 350 along the [111] crystal plane. The sharp diagonal faceting 350 occurs because there is no oxidizer in the anisotropic wet etch. The anisotropic wet etch stops etching on the amorphous etch stop region 340, so that the bottom of the trench is flat. The amorphous etch stop region 340 acts as a mask to protect the substrate surface. The side wall spacers 320 and the STI isolation regions 315 will not be etched by the anisotropic wet etch. The anisotropic wet etch may be an alkaline wet etch having a pH of approximately 10 or higher. The wet etch may be formulated of an aqueous solution containing a base such as KOH (potassium hydroxide), NaOH (sodium hydroxide), $NH_4OH$ (ammonia hydroxide), or TMAH (tetramethylammonia hydroxide). For example, a solution of 30% $NH_4OH$ by weight may be mixed with water to form an anisotropic etch solution 270 having a concentration of $NH_4OH$ by volume percent in the approximate range of 10% –100%, or more particularly a concentration of $NH_4OH$ by weight percent in the approximate range of 3%–30%. In order to control the rate of the anisotropic wet etch, the etch may be performed at approximately room temperature. To increase the etch rate the temperature may be increased. The temperature range within which the anisotropic wet etch may be performed is approximately between 15° C. and 80° C., and more particularly approximately 24° C. The etch rate may be in the approximate range of 10 nm/minute and 100 nm/minute. The substrate 300 may be etched for a time sufficient to form the undercut region 345 under the sidewall spacers 320, but not for so long as to etch under the gate dielectric 305. In one embodiment, the etch time is in the approximate range of 1 minute and 10 minutes. The longer the time of the etch, the more lateral undercutting may result. The distance that the undercut regions 345 are laterally etched may be the width of the side wall spacers 320, as illustrated in FIG. 3e. Therefore the width of the undercut regions may be in the approximate range of 5 nm–100 nm, and more particularly in the approximate range of 10 nm–30 nm.

Figure 3F:
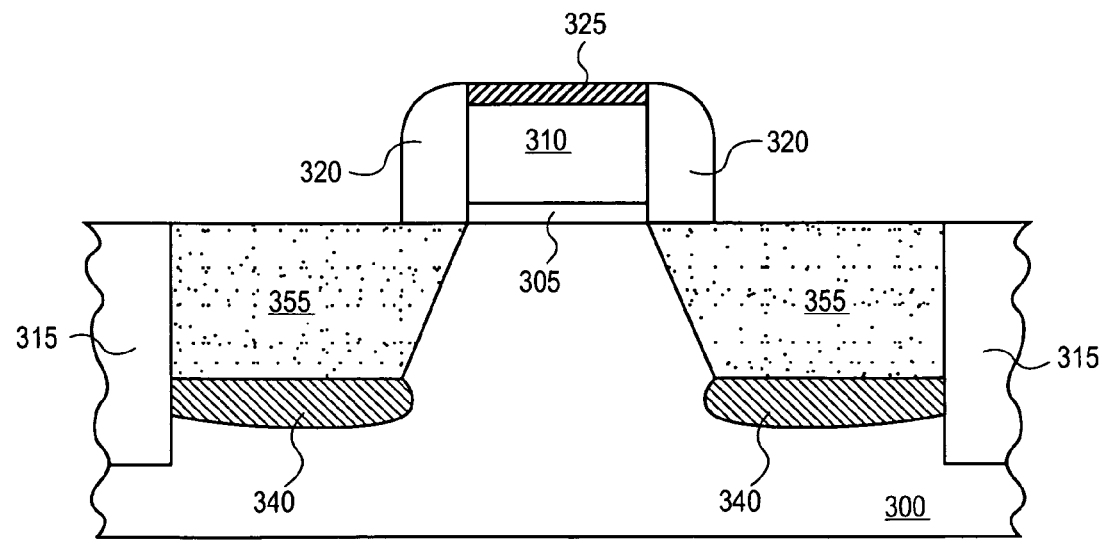
Figure 3G:
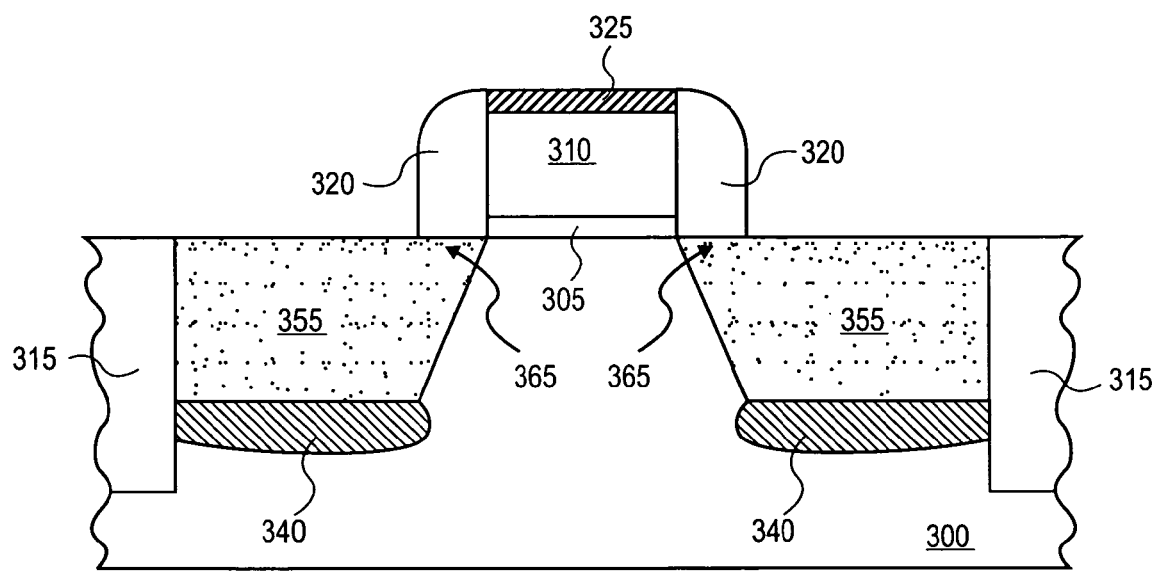

In FIG. 3f, the recesses 330 and the undercut regions 345 are backfilled with a doped semiconductor backfill material 355. During the backfilling process the substrate 300 may reach temperatures in the range of approximately 600° C. and 650° C. With these temperatures, the amorphous etch stop region 340 may be recrystallized. In an embodiment where the ionic species 335 is the same element as the substrate 300, the recrystallization of the amorphous etch stop region 340 will make that region indistinguishable from the rest of the substrate 300 as illustrated in FIG. 3g. FIG. 3g illustrates a transistor having source/drain regions 360 and source/drain tip regions 365 formed by the doped semiconductor backfill material 355 deposited in the areas formed by the etching process described above. The source/drain tip regions 365 have sharp corners and are formed right along the bottom edge of the sidewall spacers 320. This geometry provides for maximum doping of the source/drain dip regions right up to the gate dielectric 305 and the gate dielectric 310 and may cause better device performance than source/drain regions having rounded edges.

Figure 4A:
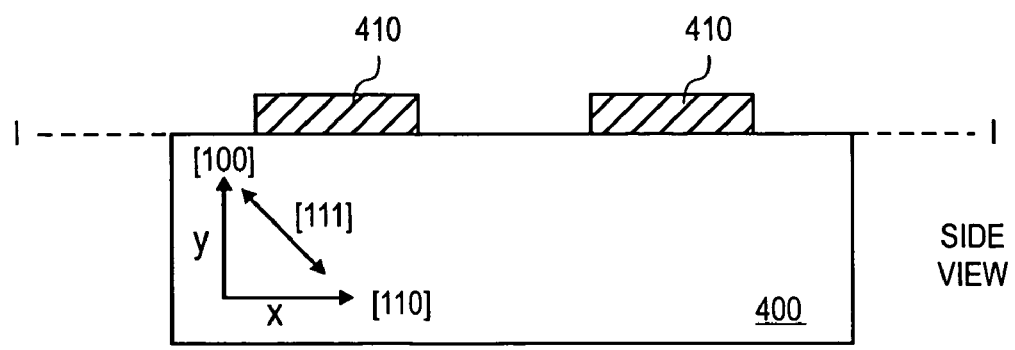
FIGS. 4a–4d illustrate a method of forming a cantilever.
Figure 4A:
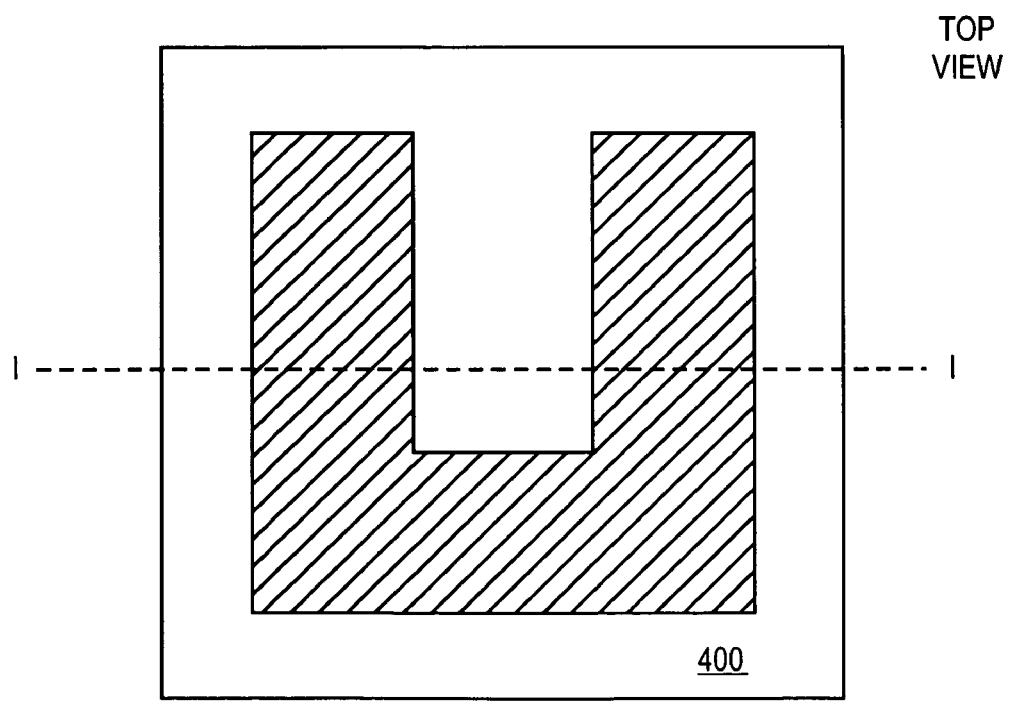
Figure 4B:
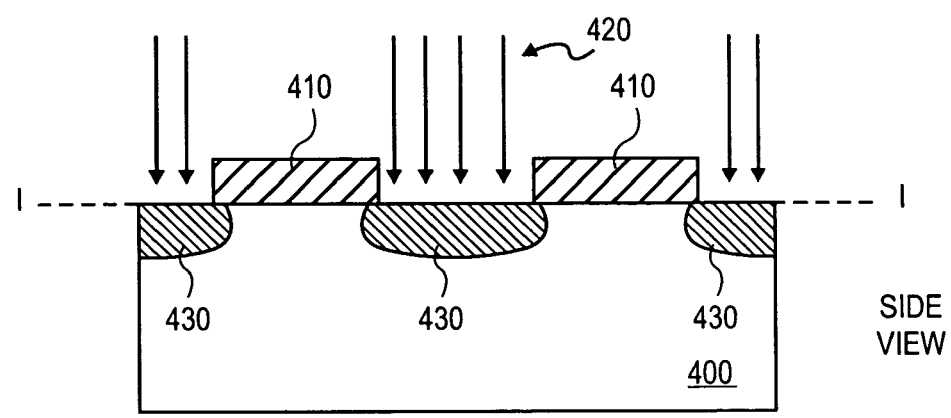
Figure 4B:
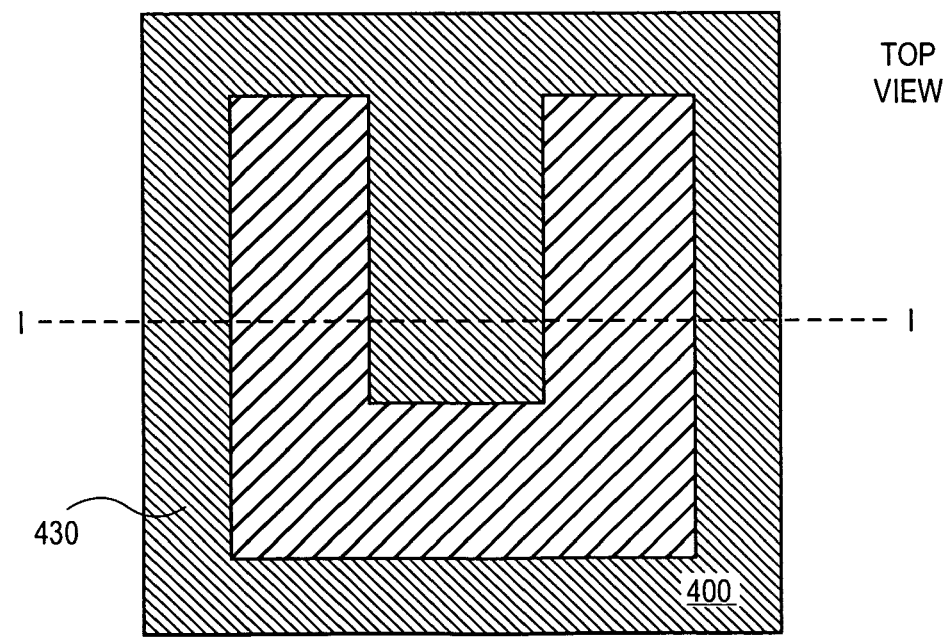

In another embodiment, the amorphous etch stop regions may be used as a mask for positive relief features where the amorphous etch stop regions are shallow and near the surface of a substrate. As illustrated in FIG. 4a–4d, a cantilever may be formed using an amorphous etch stop layer as a mask and a wet anisotropic etch on a single crystal substrate. The substrate may be a single crystal or polycrystalline semiconductor material such as silicon or germanium. In one particular embodiment, the semiconductor material is a single crystal silicon substrate. In FIG. 4a a single crystal silicon substrate 400 is provided, the single crystal silicon substrate 400 has a [100] crystal orientation in the y plane, a [110] orientation in the x plane, and a [111] crystal orientation in the plane diagonal to the x and y planes. A patterned photoresist mask 410 is formed on the substrate 400. The photoresist mask may be patterned by developing the photoresist. A top view of the substrate 400 and the photoresist mask 410, and a cross-sectional view of the same substrate 400 and photoresist mask 410 along the dotted lines I to I, are illustrated. As illustrated in the top view, the photoresist mask 410 has a square "U-shaped" pattern. The photoresist mask 410 may be a material such as silicon oxide or silicon nitride. The thickness of the photoresist mask 410 should be such that it is thick enough to block the penetration of the substrate 400 by the ionic species 420 implanted into the substrate 400. The thickness of the photoresist mask 410 is dependent on the implant energy, but generally the photoresist mask 410 may have a thickness of less than approximately 10 nm. In FIG. 4b the single crystal silicon substrate 400 may be implanted with ionic species 420 to form the amorphous regions 430. The ionic species 420 may be an element that is the same as the elements forming the substrate. In one embodiment the element implanted into the silicon substrate 400 may be silicon, and in another embodiment, the element implanted into a germanium substrate 400 may be germanium. In alternate embodiments, the element that is implanted into the substrate to form the amorphous region may be an element that is electrically neutral within the substrate. Elements that are electrically neutral within the substrate may be those elements that have a low solubility in the substrate and thus may not substitute for atoms within the crystal lattice of the substrate. Elements that may be electrically neutral within silicon are those that have an ionic radius greater than 1.2 times the size of the covalent radius of silicon and those that have an ionic radius less than 0.7 times the size of the covalent radius of silicon. The covalent radius of silicon is approximately 111 picometers (pm), so the elements that may be electrically neutral within silicon may be those with an ionic radius greater than 130 pm and those with an ionic radius less than 80 pm. Ionic species 420 with these particular ionic radii may not substitute for atoms in the silicon crystal lattice and have very low solubility within silicon, thus making such elements electrically neutral within silicon. Ionic species 420 that fit the ionic radii criteria for a silicon substrate include, for example, oxygen, nitrogen, the noble elements (Ne, Ar, Kr, etc.), the alkaline metals of column I of the periodic table (H, Li, Na, K, Rb, Cs, Fr), and the alkaline earths of column II of the periodic table (Be, Mg, Ca, Sr, Ba, Ra). The ionic species 420 may be one type of element, or a combination or elements. The ionic species 420 may be implanted into the substrate 400 in a dose of between $1\times e^{15}$ atoms/cm$^2$ and $1\times e^{16}$ atoms/cm$^2$ and at an implant energy within the approximate range of 1 KeV and 20 KeV, and more particularly approximately 5 KeV to form a concentration of the ionic species 420 within the substrate 400 of approximately $1\times e^{21}$ atoms/cm$^3$. The implant energy may be dependent on the ionic species 420 being implanted and the implant energy may be as low as possible to avoid damage to the substrate 400. The ionic species 420 may be implanted to a depth in the approximate range of zero nanometers (on the surface only) and 50 nm.

Figure 4C:
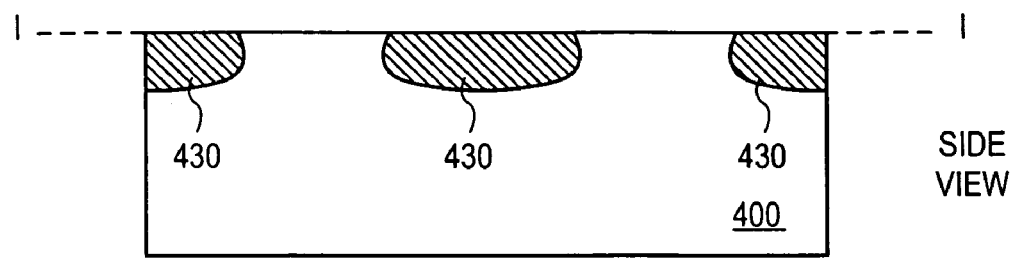
Figure 4C:
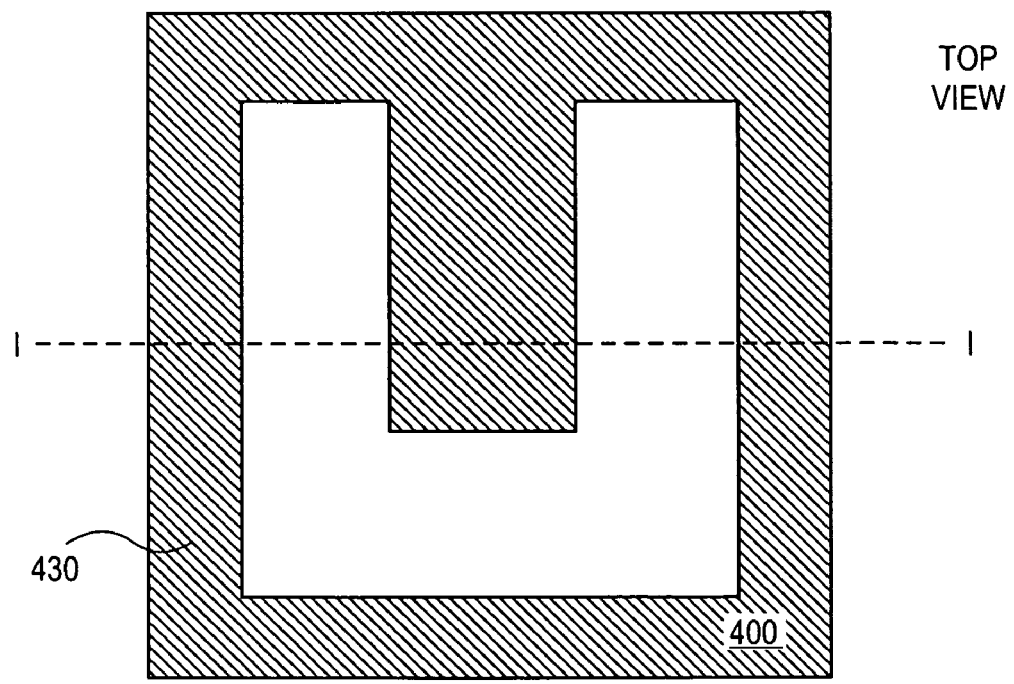
Figure 4D:
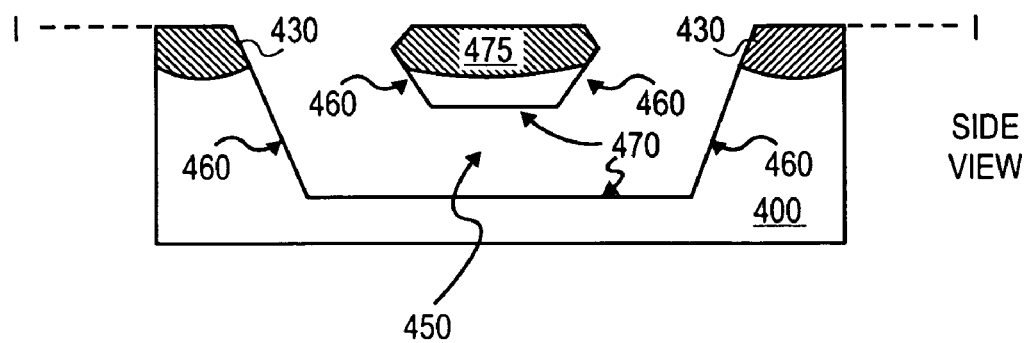
Figure 4D:
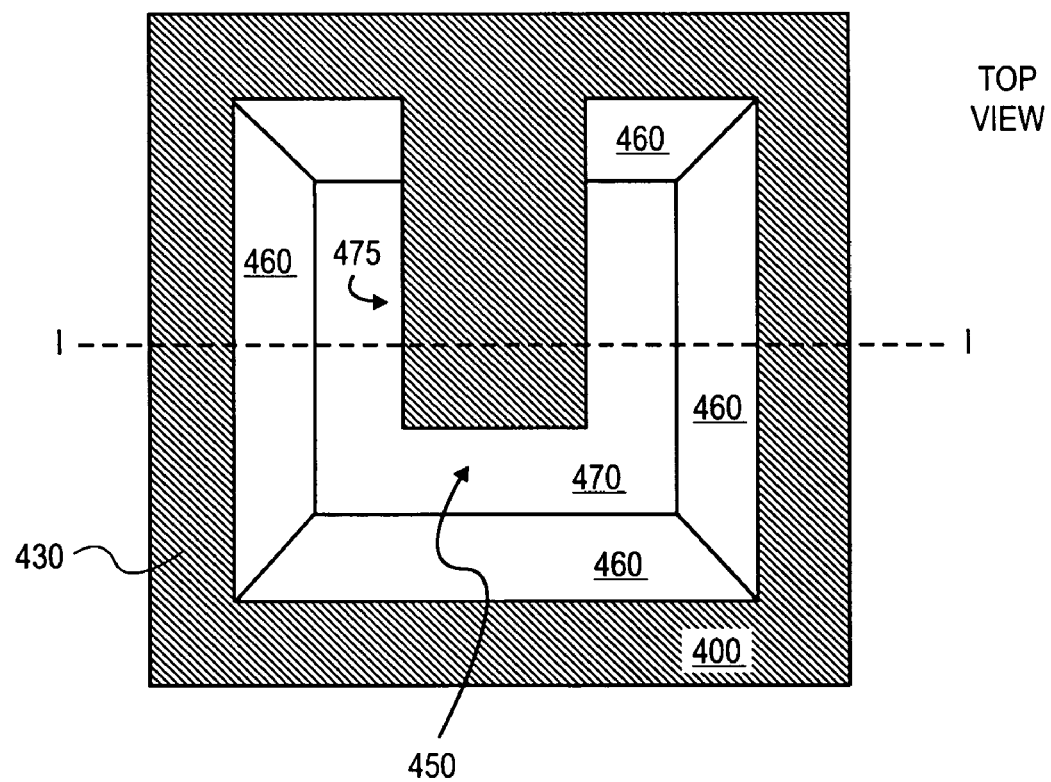

The photoresist mask 410 may then be removed as illustrated in FIG. 4c to expose the non-implanted regions of the single crystal silicon substrate 400. The non-implanted regions of the substrate 400 reflect the "U-shaped" area of the photoresist mask 410 before it was removed and may have the same dimensions. In FIG. 4d the single crystal silicon substrate 400 is etched with an anisotropic wet etch solution and the amorphous regions 430 will act as a hard mask. The anisotropic wet etch solution may be an alkaline wet etch having a pH above approximately 10. The anisotropic wet etch solution may be formed with a base such as KOH (potassium hydroxide), NaOH (sodium hydroxide), NH$_4$OH (ammonia hydroxide), or TMAH (tetramethylammonia hydroxide). For example, a solution of 30% NH$_4$OH by volume may be mixed with water to form an anisotropic wet etch solution having a concentration of NH$_4$OH by volume percent in the approximate range of 10%–100%, or more particularly a concentration of NH$_4$OH by weight percent in the approximate range of 3%–30%. In order to control the rate of the anisotropic wet etch, the etch may be performed at approximately room temperature. To increase the etch rate the temperature of the anisotropic wet etch solution may be increased. The temperature range within which the anisotropic wet etch may be performed is approximately between 15° C. and 80° C. and more particularly approximately 24° C. The etch rate may be in the approximate range of 10 nm/minutes and 100 nm/minutes. The substrate 400 may be etched for a time in the approximate range of 1 minute and 10 minutes. The longer the time of the etch, the larger the dimensions of the recess 450. An oxidizing agent may not be included in the anisotropic wet etch solution because if the substrate 400 is oxidized the etching may stop and the strong faceting 460 along the [111] crystal plane may not occur. This is particularly true of substrates such as silicon. The anisotropic wet etch solution may etch along the [111] diagonal crystal planes 460, and along the [100] vertical crystal plane to form the cantilever 475. In its final form, the cantilever 475 may be shaped like a diving board protruding out over the recess 450. The cantilever 475 may be formed due to the lateral undercutting of the amorphous regions 430 that forms the core of the cantilever 475 by the anisotropic wet etch. The flat portions 470 of the recess 450 are formed due to the geometry of the anisotropic wet etch solution along the horizontal [110] crystal planes of the single crystal silicon substrate 400. The use of a square "mask" formed by the amorphous regions 430 leads to the formation of the flat portions 470 of the recess 450. The recess 450 may have an aspect ratio in the approximate range of 1:1 and 1:5. The cantilever 475 may be used as a pressure or accelerometer.

Several embodiments of the invention have thus been described. However, those of ordinary skill in the art will recognize that the invention is not limited to the embodiments described, but can be practiced with modification and alteration within the scope and spirit of the appended claims that follow.

We claim:

1. A method comprising:
   forming a gate and a pair of sidewall spacers on either side of the gate above a single-crystal silicon substrate having a vertical [100] crystal plane, a horizontal [110] crystal plane, and a diagonal [111] crystal plane;
   etching a recess in the single-crystal silicon substrate along the vertical [100] crystal plane with an anisotropic dry plasma etch;
   implanting silicon into the bottom of the recess to form an amorphous etch stop;
   etching the recess along the diagonal [111] crystal plane with an anisotropic wet etch having a pH of at least approximately 10 and no oxidizer; and
   filling the recess with an electronically doped silicon germanium material to form a source/drain region.

2. The method of claim 1, further comprising a source/drain tip implant region under the sidewall spacers.

3. The method of claim 1, further comprising a shallow trench isolation region comprising an oxide and wherein the anisotropic wet etch does not etch the shallow trench isolation region or a hardmask protecting the gate.

4. The method of claim 1, wherein filling the recess with an electronically doped silicon germanium material forms an epitaxial source/drain tip extension region underneath the gate.

5. A transistor, comprising:
   a crystalline semiconductor substrate having a plurality of vertical [100] crystal planes, a plurality of horizontal [110] crystal planes, and a plurality of diagonal [111] crystal planes;
   a gate electrode formed above the crystalline semiconductor substrate;
   a pair of sidewall spacers, one on each side of the gate electrode; and
   a pair of source/drain regions, one source/drain region under each of the sidewall spacers and wherein the source/drain regions are defined by the bottom of the spacers and by the diagonal [111] crystal planes.

6. The structure of claim 5, wherein the pair of source/drain regions extend beneath the pair of sidewall spacers by a distance of up to the width of one of the pair of sidewall spacers.

7. The structure of claim 5, wherein the pair of source/drain regions extend under the gate electrode by a distance in the approximate range of 10% and 20% of the width of the gate electrode.

* * * * *